(12) United States Patent
Fiocchi et al.

(10) Patent No.: US 9,377,801 B2
(45) Date of Patent: Jun. 28, 2016

(54) LOW-DROPOUT REGULATOR AND METHOD FOR REGULATING VOLTAGE

(71) Applicant: ams AG, Unterpremstätten (AT)

(72) Inventors: Carlo Fiocchi, Belgioioso (IT); Alessandro Carbonini, Redavalle (IT)

(73) Assignee: AMS AG, Unterpremstaetten (AT)

( * ) Notice: Subject to any disclaimer, the term of this patent is extended or adjusted under 35 U.S.C. 154(b) by 121 days.

(21) Appl. No.: 14/221,184

(22) Filed: Mar. 20, 2014

(65) Prior Publication Data

US 2014/0285166 A1  Sep. 25, 2014

(30) Foreign Application Priority Data

Mar. 21, 2013 (EP) ..................................... 13160438

(51) Int. Cl.
| | |
|---|---|
| *G05F 1/00* | (2006.01) |
| *H02H 7/00* | (2006.01) |
| *H02H 9/00* | (2006.01) |
| *G05F 1/575* | (2006.01) |
| *H03H 7/06* | (2006.01) |

(52) U.S. Cl.
CPC . *G05F 1/575* (2013.01); *H03H 7/06* (2013.01)

(58) Field of Classification Search
USPC ......... 323/241, 246, 273–276, 280, 282–285; 361/18
See application file for complete search history.

(56) References Cited

U.S. PATENT DOCUMENTS

| | | | |
|---|---|---|---|
| 2006/0232327 A1 | 10/2006 | Takagi et al. | |
| 2011/0121802 A1 | 5/2011 | Zhu | |
| 2013/0049721 A1* | 2/2013 | Lo | G05F 1/575 323/280 |
| 2013/0293209 A1* | 11/2013 | Wu | G05F 1/565 323/282 |

FOREIGN PATENT DOCUMENTS

EP           2551743 A1       1/2013

* cited by examiner

*Primary Examiner* — Adolf Berhane
*Assistant Examiner* — Gary Nash
(74) *Attorney, Agent, or Firm* — McDermott Will & Emery LLP

(57) ABSTRACT

In one embodiment a low-dropout regulator comprises a first differential amplifier (Nmos1) to receive an input voltage (Vin), a power transistor (T1) coupled to the first differential input pair (Nmos1), the power transistor having an output (OUT) forming an output terminal of the low-dropout regulator to provide an output voltage (Vout) as a function of the input voltage (Vin), a second differential amplifier (Pmos1) coupled to the first differential amplifier (Nmos1), and a switching element (Mncut1, Mncut2) coupled between first and second differential amplifier (Nmos1, Pmos1), said switching element (Mncut1, Mncut2) being operated as a function of a feedback signal (Sfb) derived from the output voltage (Vout). The second differential amplifier (Pmos1) is complementary to the first differential amplifier (Nmos1). The low-dropout regulator is operated in one of two modes such that in a first mode the second differential amplifier (Pmos1) is enabled and in the second mode the first differential amplifier (Nmos1) is enabled and the second differential amplifier (Pmos1) is disabled by means of the switching element (Mncut1, Mncut2).

12 Claims, 3 Drawing Sheets

LOW-DROPOUT REGULATOR AND METHOD FOR REGULATING VOLTAGE

CROSS-REFERENCE TO RELATED APPLICATIONS

Figure 1:
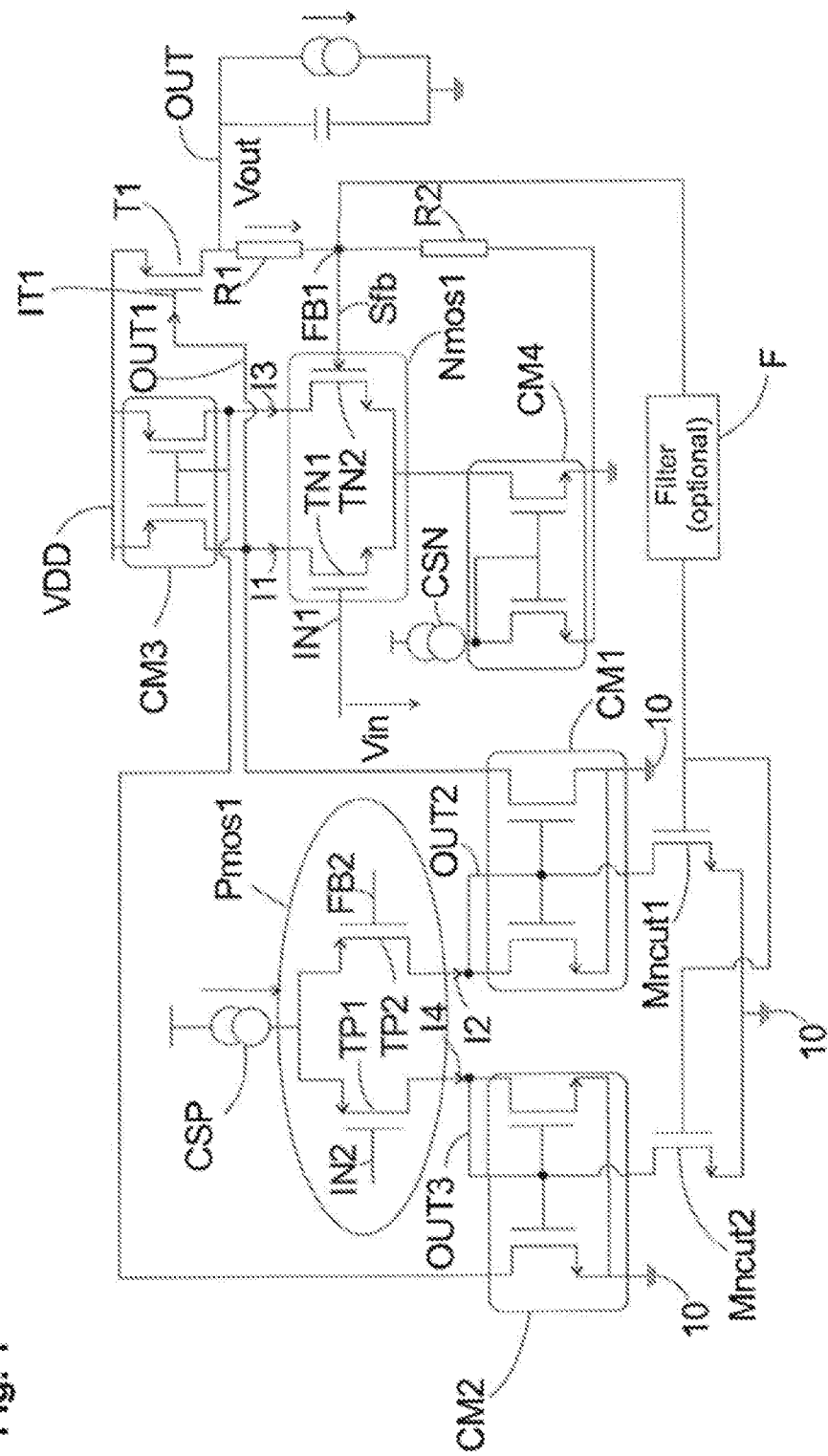

The present application claims priority to European Patent Application No. 13160438.1, filed on Mar. 21, 2013, which is hereby incorporated by reference in its entirety for all purposes.

DESCRIPTION

The invention relates to a low-dropout regulator and to a method for voltage regulation.

Low-dropout regulators, LDOs, usually employ a differential amplifier, which controls a controlled section of a power transistor. The differential amplifier has a reference input which is supplied with a reference voltage and a feedback input which is supplied with a feedback voltage, which is derived from an output voltage at the power transistor. An input stage of the differential amplifier is often built with n-channel metal oxide semiconductor, NMOS, transistors, which may have an improved minimum voltage supply requirement, a lower number of branches for low power applications, a lower input offset and a prompter transient response, compared to a p-channel metal oxide semiconductor, PMOS input stage. A PMOS transistor is usually employed as power transistor.

However, this kind of LDO has an intrinsic weakness in that the output tends to largely overshoot at start up. The reason for this appears clear: when either the reference or the feedback input of the LDO have not yet reached a threshold voltage of an NMOS transistor used for implementing the differential amplifier to comply with the dynamic range of the input stage, the power transistor's gate is floating. This leads to the following situations:

a) If this gate is pulled low by internal leakage, parasitic coupling to digital signals or transients in a power up sequence, it might generate a very large, uncontrolled, current.

b) In case this gate is pulled high by the same above listed factors, the output of the LDO stays at ground.

While the first situation is usually corrected when the feedback input reaches the NMOS threshold to stop the current from the power transistor, the second situation moves from a still condition only when the input reference crosses the NMOS threshold.

Yet, in both cases the situation might appear unacceptable as the action of the differential amplifier becomes extremely critical: in the first case it has to very promptly stop the large current in the power transistor to avoid a further increase of the output voltage above the steady state value; in the second, being the reference input higher than the feedback input, the power transistor is brought in strong conduction so that all the tail current of the stage is driven to pull down its gate. Consequently, only after the feedback input has become comparable to the reference input, the current in the power transistor starts decreasing. Usually the tail current fully pulls down the power transistor until the difference between the input reference and the feedback input is less than 100 mV.

Also in this case it is mandatory to stop the current in the power transistor promptly to avoid that the output exceeds the steady state value. As the steady state value at the LDO input is usually a band gap voltage, a resulting safety margin between the NMOS threshold, when loop starts regulating, and the steady state value is quite small.

Due to several design constraints and delays occurring within the differential amplifier, is not possible, to achieve such prompt action in the differential amplifier. As a result, LDOs are affected by remarkable overshooting.

Several techniques to reduce the overshoot are known. One example is to design a very fast current limiter whose threshold is smaller at start up. This limits the current in the power transistor and reduces the possibility to overshoot. This design however is quite challenging and usually asks for a large power consumption in this stage.

Unfortunately the known techniques often appear as a "patch" to a system not specifically designed for that performance. This kind of remedies are successful but ask for a lot of cumbersome design effort and often their effectiveness is limited to particular operating conditions.

It is therefore an objective to provide a low-dropout regulator which avoids overshooting during start up while still keeping power consumption low.

The objective is achieved with the subject matter of the independent claims. Embodiments and developments of the invention are the subject matter of the dependent claims.

In one embodiment a low-dropout regulator comprises a first differential amplifier, a power transistor, a second differential amplifier and a switching element. The first differential amplifier is adapted to receive an input voltage. The power transistor is coupled to the first differential amplifier and has an output forming an output terminal of the low-dropout regulator to provide an output voltage as a function of the input voltage. The second differential amplifier is coupled to the first differential amplifier. The switching element is coupled between the first and the second differential amplifier and is operated as a function of a feedback signal derived from the output voltage. The second differential amplifier is complementary to the first differential amplifier. Thereby, the low-dropout regulator is operated in one of two modes such that in a first mode the second differential amplifier is enabled and in a second mode the second differential amplifier is switched off by means of the switching element.

While the input voltage starts to rise, for example from ground potential, the first mode is assumed in which the second differential amplifier is enabled and the power transistor is activated as well. Consequently, a rise of the input voltage is tracked from the very beginning. As soon as the input voltage rises above a certain threshold level, the switching element disables the second differential amplifier and operates the low-dropout regulator in the second mode. In this mode, the first differential amplifier is active and contributes to producing the output voltage in combination with the power transistor.

As the ramp of the input voltage is tracked from the beginning by means of the second differential amplifier, overshooting is avoided during start up of the low-dropout regulator. Furthermore, power consumption is reduced to a minimum by actively switching off the second differential amplifier in the second mode.

In an exemplary implementation, the first differential amplifier is implemented using a pair of NMOS transistors. The second differential amplifier is realized by a pair of PMOS transistors complementary to the first differential amplifier.

Switchover between first and second mode occurs, for instance, as soon as the input voltage reaches a threshold voltage of the first differential amplifier.

In the first mode, the first differential amplifier is disabled as the input voltage is below its threshold voltage.

In a further development the first differential amplifier comprises a first reference input to receive the input voltage, a feedback input to receive the feedback signal and a first output which is coupled to a control input of the power transistor.

The feedback signal is derived from the output voltage, e.g. by means of a voltage divider connected to the output terminal of the low-dropout regulator. The connection point between the two resistors of the voltage divider forms a feedback node which is connected to the first feedback input.

In another development, the second differential amplifier comprises a second reference input to receive the input voltage, a second feedback input to receive the feedback signal, a second output coupled to the control input of the power transistor and a third output.

In an exemplary realization a voltage buffer is inserted before the control input of the power transistor. The voltage buffer is then used to drive the power transistor.

In another development the switching element comprises a first and a second transistor. The first transistor has a control input to receive the feedback signal and a controlled section connected between the second output of the second differential amplifier and a reference potential terminal. The second transistor has a control input to receive the feedback signal and a controlled section connected between the third output of the second differential amplifier and the reference potential terminal.

By means of the feedback signal first and second transistors of the switching element are coupled to the dynamic range of the input stage of the low-dropout regulator which comprises first and second differential amplifiers.

In an alternative embodiment the switching element comprises a third transistor with a control input to receive the feedback signal and controlled section connected between a supply input of the second differential amplifier and the reference potential terminal.

In both of these embodiments the switching element is matched to the first differential amplifier.

Either first and second transistors are both matched to the transistors of the first differential amplifier, or the third transistor is matched to one of the transistors of the first differential amplifier. Matching is effected with respect to a threshold voltage of a transistor selected for implementation, for example.

In another embodiment, the LDO further comprises a first current mirror connected to the second output of the second differential amplifier and the reference potential terminal and a second current mirror connected to the third output of the second differential amplifier and the reference potential terminal.

By this, respective currents provided at the second and third output of the second differential amplifier are mirrored for subsequent mixing with corresponding currents output by the first differential amplifier. One of these currents is coupled to a control input of the power transistor.

In one embodiment a method for regulating voltage comprises the following steps:
- supplying an input voltage to a first and second differential amplifier of a low-dropout regulator,
- providing an output voltage as a function of the input voltage by a power transistor of the low-dropout regulator,
- deriving a feedback signal from the output voltage and providing the feedback signal to the first and the second differential amplifier,
- providing a switching element arranged between the first and the second amplifier, and
- operating the LDO as a function of the feedback signal in one of two modes such that in a first mode the second differential amplifier is enabled, and that in the second mode the second differential amplifier is switched off.

In the first mode the second differential amplifier, which is preferably implemented as a PMOS input stage, is active. Consequently, a rise in the input voltage is properly reflected in the output voltage. In the second mode, the second differential amplifier is switched off. Only the first differential amplifier, which is preferably realized by an NMOS input stage, is active until the input voltage reaches its final steady state value.

As a result, during the start up phase of the LDO overshooting of the output voltage, especially an overshooting above the level of the steady state value of the input voltage, is prevented. Low power consumption is achieved by switching off the second differential amplifier in the second mode.

In a further development, in the first mode the input voltage is below a threshold voltage of the first differential amplifier. In the second mode the input voltage has surpassed the threshold voltage of the first differential amplifier.

In a further development the input voltage is supplied as a ramping signal.

The input voltage is, for instance, supplied by a band gap reference via a ramping generator for the start up phase of the LDO.

In the first mode, as long as the input voltage is below the threshold voltage of the first differential amplifier implemented as NMOS input stage, only the second differential amplifier implemented as PMOS input stage is enabled and contributes to the output voltage via the power transistor. When the input voltage reaches the value of the threshold voltage, the second mode is entered. The first differential amplifier becomes active. The switching element switches off the second differential amplifier, so that the startup phase of the LDO is completed, mainly using the first differential amplifier and the power transistor.

As an advantage, by switching off the second differential amplifier in the second mode, additional power consumption, as well as noise and offset contribution of the second differential amplifier is eliminated from the second mode onwards and also during operation of the LDO in its common mode input voltage operating range. The LDO then behaves like a traditional NMOS-based LDO known to those skilled in the art.

In another development, the method comprises the step of summing up a first current and a third current output by the first differential amplifier and a second current and a fourth current output by the second differential amplifier to form a control current for the power transistor.

Figure 2A:
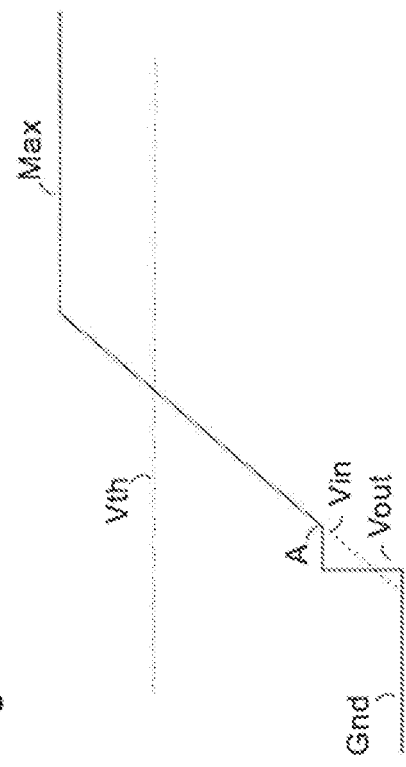
Figure 2B:
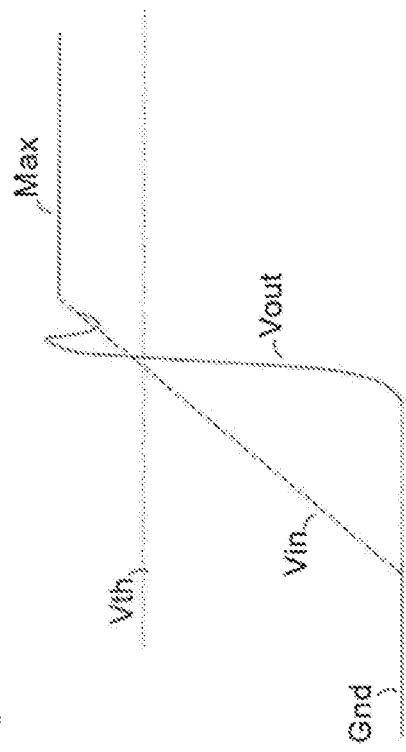
Figure 3:
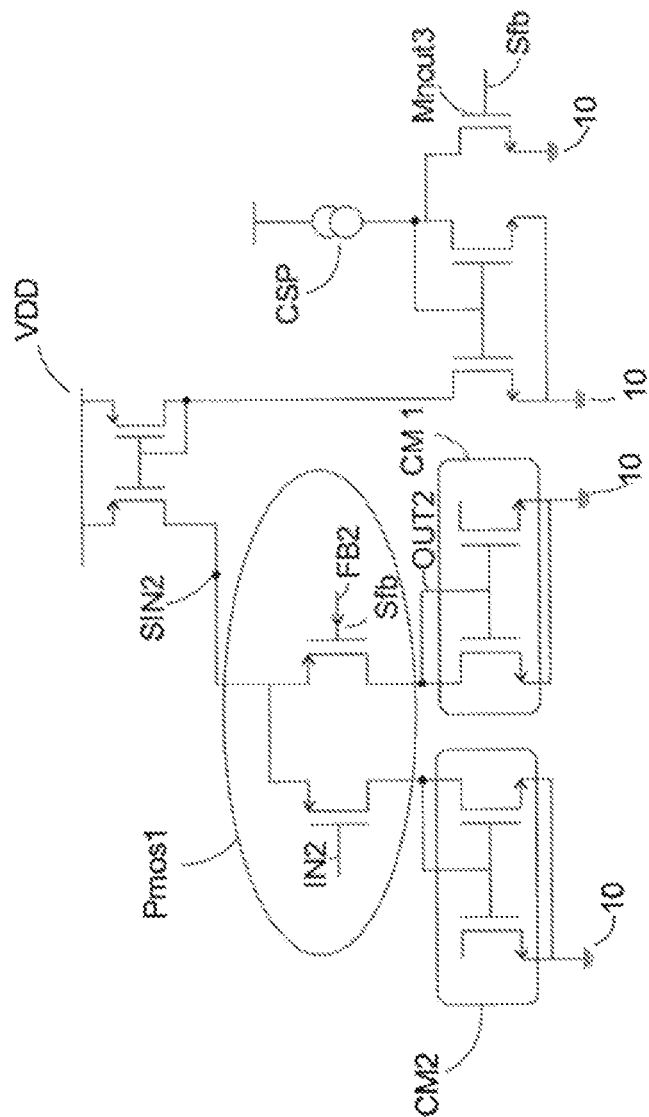

The text below explains the invention in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures. Therein:

FIG. 1 shows a first exemplary embodiment of a low-dropout regulator according to the proposed principle, FIGS. 2a, 2b show signal diagrams, and FIG. 3 shows a second implementation example of a switching element for a low-dropout regulator according to the proposed principle.

FIG. 1 shows a first exemplary embodiment of a low-dropout regulator according to the proposed principle. The LDO comprises a first differential amplifier NMOS1, a second differential amplifier PMOS1, a power transistor T1 and a switching element Mncut1, Mncut2. The first differential amplifier NMOS1 comprises two NMOS transistors TN1, TN2 which are coupled by their respective source terminals. A gate terminal of the first NMOS transistor TN1 forms a first reference input IN1 of the LDO which receives an input voltage Vin. A first current I1 is provided at a drain terminal of transistor TN1. A gate terminal of the second transistor TN2 of the first differential amplifier NMOS1 forms a first feedback input FB1 which receives a feedback signal Sfb. The first differential amplifier NMOS 1 is coupled to a first current source CSN which provides a tail current for the first differential amplifier NMOS1 via a fourth current mirror CM4. The tail current biases usually a differential stage, here the first differential amplifier Nmos1. As soon as one of the nodes of the differential amplifier Nmos1 between the first reference input IN1 and the feedback signal Sfb rises above a threshold voltage, the tail current is activated. The current mirror CM4 is coupled also to a reference potential terminal 10. On the other side, the first differential amplifier NMOS1 is connected to a positive supply voltage VDD via a third current mirror CM3.

The second differential amplifier PMOS1 comprises two PMOS transistors TP1, TP2 which are coupled by their respective source terminals. A gate terminal IN2 of the first PMOS transistor TP1 forms a second reference input of the second differential amplifier PMOS1 which also receives the input voltage Vin. A gate terminal of the second PMOS transistor TP2 of the second differential amplifier PMOS1 forms a second feedback input FB2 which also receives the feedback signal Sfb. At a drain terminal of this second transistor TP2 a second output current 12 is provided. The source terminals of the transistors TP1, TP2 of the second differential amplifier PMOS1 are each coupled via a second current source CSP to the positive supply voltage VDD. A drain terminal of the second transistor TP2 forms a second output OUT2. A drain terminal of the first transistor TP1 of the second differential amplifier PMOS1 forms a third output OUT3. The second output OUT2 is coupled via a first current mirror CM1 to the drain terminal of the first transistor TN1 of the first differential amplifier NMOS1. At this drain terminal the first current I1 provided by the first differential amplifier NMOS1 and the second current I2 provided by the second differential amplifier PMOS1 are mixed or summed up to form a control current IT1 which controls the power transistor T1. An equal synergetic contribution to the control current IT1 comes from a third current I3 provided as a drain current by the second transistor TN2 of the first differential amplifier NMOS1 and from a fourth current I4 provided as a drain current by the first transistor TP1 of the second differential amplifier PMOS1. The third current I3 and the fourth current I4 are each mirrored in the third current mirror CM3. The third output terminal OUT3 of the second differential amplifier PMOS1 is coupled via a second current mirror CM2 to the drain terminal of the second transistor TN2 of the first differential amplifier NMOS1.

The power transistor T1 is coupled with its source terminal to the positive supply voltage VDD. Its gate terminal receives the control current IT1. The drain terminal of the power transistor T1 forms an output OUT of the LDO at which an output voltage Vout is provided. A voltage divider R1, R2, is connected at the output OUT. The other terminal of the voltage divider R1, R2 is coupled to the reference potential terminal 10. The feedback signal Sfb is derived from the output voltage Vout at a connection point between resistor R1 and resistor R2 of the voltage divider.

The switching element in this example comprises a first transistor Mncut1 and a second transistor Mncut2. Both transistors of the switching element are realized as NMOS transistors which are matched to the NMOS transistors of the first differential amplifier NMOS1. Each gate terminal of first and second transistor Mncut1, Mncut2 forms a control input and receives the feedback signal Sfb. Each source terminal of first and second transistor Mncut1, Mncut2 is coupled to the reference potential terminal 10. A drain terminal of the first transistor Mncut1 is connected to a drain terminal of the second transistor TP2 of the second differential amplifier PMOS1 and a control terminal of the first current mirror CM1. A drain terminal of the second transistor Mncut2 is connected to the third output OUT3 of the second differential amplifier PMOS1 and to a control terminal of the second current mirror CM2.

A filter circuit F, which is optional, is coupled in this example in the path of the feedback signal Sfb and is consequently inserted before the gate terminals of the switching element Mncut1, Mncut2. The filter circuit F prevents spurious turn on or turn off of transistors Mncut1, Mncut2. This might occur in case of a large transition at the output OUT, mostly if a stabilizing capacitor is inserted between the first feedback input FB1 and the output OUT.

It is well understood by those skilled in the art, that the LDO can realize unit gain or any other desired gin value by respectively choosing the values of resistors R1, R2.

Operation of the LDO will be explained below in combination with FIG. 2B.

FIG. 2A shows a signal diagram for the startup phase of an NMOS-based LDO of the start of the art. The input voltage Vin is shown in a dashed line, whereas the output voltage Vout is represented as a continuous line. The input voltage Vin rises from a first value, for example ground potential Gnd, to a second value Max, representing the steady state of input and output voltages Vin, Vout. In an NMOS-based LDO of the state of the art the output voltage Vout stays low until the ramp of the input voltage Vin reaches a threshold voltage Vth of the employed NMOS transistors and turns on the tail current. The output voltage Vout tends to reach the input voltage Vin with a strong jump. An overshoot during which the output voltage Vout reaches to a value above the steady state value Max of the input voltage Vin occurs if the threshold voltage Vth is not low enough in comparison to the steady state value Max of the input voltage Vin. This overshoot is detrimental for the reliability of the connected load.

FIG. 2B shows signal diagrams for an LDO according to the proposed principle during start up. The input voltage Vin starts rising in a linear way according to the ramp as depicted in FIG. 2B. The second differential amplifier PMOS1 of FIG. 1 is active from the very beginning of the input voltage Vin ramp at ground level Gnd. Because of the second current I2 provided by the second differential amplifier PMOS1, the power transistor T1 starts driving current, so that the output voltage Vout reaches the level of the input voltage Vin ramp in a very short time at a point A. As the differential input is very small, the power transistor's T1 gate terminal is not pulled down so strongly and therefore generation of a large overshoot is eliminated. As soon as the NMOS threshold voltage Vth is reached, the second differential amplifier PMOS1 is switched off. The first differential amplifier NMOS1 is now capable of completing the start up phase until the input voltage Vin reaches the desired value Max of the input common mode voltage.

In short, the switching element, here first transistor Mncut1, senses if the first differential amplifier Nmos1 has enough swing to operate. If this condition is met, the switching element switches off the second differential amplifier's Pmos1 tail current to prevent that current injected from the second differential amplifier Pmos1 reaches the power transistor T1.

As can be seen from FIG. 2b, the amplitude of the spike is very small and settling is reached around a value which is near ground potential Gnd, safely far away from the steady state value Max. As a result, the LDO can track the input voltage Vin ramp nearly from the beginning. Overshooting is prohibited.

FIG. 3 shows a second implementation example of a switching element for a low-dropout regulator according to the proposed principle. Here, the focus is on the switching element as an alternative to the realization of the switching element in FIG. 1. The switching element in this example comprises just one transistor Mncut3 realized as NMOS transistor. The source terminal of transistor Mncut3 is coupled to the reference potential terminal 10. The drain terminal of transistor Mncut3 is coupled to the second current source CSP of the second differential amplifier PMOS1.

As soon as the gate of transistor Mncut3 is above an NMOS threshold, the tail current of the second differential amplifier PMOS1 is subtracted and no current can flow towards the output OUT from this section. This solution saves power as the residual current flowing across transistor Mncut3 can be made much smaller than the tail current of the second differential amplifier PMOS1 without loosing in dynamic and accuracy performance. In fact, usually the NMOS mirrors receiving the second differential amplifier's PMOS1 current are designed to be fast to improve LDO phase margin. Hence the current across transistors Mncut1 and Mncut2 cannot be as small as the one across transistor Mncut3

In an alternative embodiment, a rail-to-rail amplifier is used for implementing first and second differential amplifiers NMOS1, PMOS1 of the invented low-dropout regulator. In this realization it has to be considered that the steady state condition of the LDO requires a fixed input voltage, not a variable signal as in the case of a rail-to-rail amplifier. Therefore, it is a prerequisite to switch off the PMOS input stage of the rail-to-rail amplifier by means of the proposed switching element of the invented LDO complying with the principle of first and second mode as described above. In this alternative, in the first mode only the second differential amplifier PMOS1 is active while thee first differential amplifier NMOS1 is off. First and second differential amplifiers NMOS1 and PMOS 1 are not active concurrently in any mode of operation.

The embodiments described above, in particular single features of these embodiments, can be combined in various ways.

The invention claimed is:

1. A low-dropout regulator comprising:
a first differential amplifier (Nmos1) to receive an input voltage (Vin);
a power transistor (T1) coupled to the first differential amplifier (Nmos1), the power transistor having an output (OUT) forming an output terminal of the low-dropout regulator to provide an output voltage (Vout) as a function of the input voltage (Vin);
a second differential amplifier (Pmos1) coupled to the first differential amplifier (Nmos1); and
a switching element (Mncut1, Mncut2) coupled between first and second differential amplifier (Nmos1, Pmos1), said switching element (Mncut1, Mncut2) being operated as a function of a feedback signal (Sfb) derived from the output voltage (Vout),
wherein the second differential amplifier (Pmos1) is complementary to the first differential amplifier (Nmos1),
wherein the low-dropout regulator is operated in one of two modes such that in a first mode the second differential amplifier (Pmos1) is enabled and in a second mode the second differential amplifier (Pmos1) is switched off by means of the switching element (Mncut1, Mncut2), and wherein in the first mode the input voltage (Vin) is below a threshold voltage (Vth) of the first differential amplifier (Nmos1), and in the second mode the input voltage (Vin) has surpassed the threshold voltage (Vth) of the first differential amplifier (Nmos1).

2. The low-dropout regulator according to claim 1, wherein the first differential amplifier (Nmos1) comprises a first reference input (IN1) to receive the input voltage (Vin), a first feedback input (FB1) to receive the feedback signal (Sfb) and a first output (OUT1) coupled to a control input of the power transistor (T1).

3. The low-dropout regulator according to claim 1 or 2, wherein the second differential amplifier (Pmos1) comprises a second reference input (IN2) to receive the input voltage (Vin), a second feedback input (FB2) to receive the feedback signal (Sfb), a second output (OUT2) coupled to the control input of the power transistor (T1) and a third output (Out3).

4. The low-dropout regulator according to claim 3, wherein the switching element (Mncut1, Mncut2) comprises:
a first transistor (Mncut1) with a control input to receive the feedback signal (Sfb) and a controlled section connected between the second output (Out2) of the second differential amplifier (Pmos1) and a reference potential terminal (10); and
a second transistor (Mncout2) with a control input to receive the feedback signal (Sfb) and a controlled section connected between the third output (Out3) of the second differential amplifier (Pmos1) and the reference potential terminal (10).

5. The low-dropout regulator according to claim 3, wherein the switching element (Mncut1, Mncut2) comprises a third transistor (Mncut3) with a control input to receive the feedback signal (Sfb) and a controlled section connected between a supply input (SIN2) of the second differential amplifier (Pmos1) and the reference potential terminal (10).

6. The low-dropout regulator according to claim 1, wherein the switching element (Mncut1, Mncut2) is matched to the first differential amplifier (Nmos1).

7. The low-dropout regulator according to claim 1, further comprising a filter circuit (F) which is connected between the output (OUT) of the low-dropout regulator and the switching element (Mncut1, Mncut2).

8. The low-dropout regulator according to claim 1, further comprising a first current mirror (CM1) connected to the second output (OUT2) of the second differential amplifier (Pmos1) and the reference potential terminal (10) and a second current mirror (CM2) connected to the third output (OUT3) of the second differential amplifier (Pmos1) and the reference potential terminal (10).

9. A method for regulating voltage comprising the following steps:
supplying an input voltage (Vin) to a first and a second differential amplifier (Nmos1, Pmos1) of a low-dropout regulator;
providing an output voltage (Vout) as a function of the input voltage (Vin) by a power transistor (T1) of the low-dropout regulator;
deriving a feedback signal (Sfb) from the output voltage (Vout) and providing the feedback signal (Sfb) to the first and the second differential amplifier (Nmos1, Pmos1);
providing a switching element (Mncut1, Mncut2) arranged between the first and the second differential amplifier (Nmos1, Pmos1); and operating the low-dropout regulator as a function of the feedback signal (Sfb) in one of two modes such
that in a first mode the second differential amplifier (Pmos1) is enabled, and
that in a second mode the second differential amplifier (Pmos1) is switched off by the switching element (Mncut1, Mncut2),
wherein in the first mode the input voltage (Vin) is below a threshold voltage (Vth) of the first differential amplifier (Nmos1), and in the second mode the input voltage (Vin) has surpassed the threshold voltage (Vth) of the first differential amplifier (Nmos1).

10. The method according to claim 9, wherein the input voltage (Vin) is supplied as a ramping signal.

11. The method according to claim 9, further comprising summing up a first current (I1) and a third current (I3) output by the first differential amplifier (Nmos1) and a second current (I2) and a fourth current (I4) output by the second differential amplifier (Pmos2) to form a control current (IT1) for the power transistor (T1).

12. The method according to claim 11, further comprising mirroring and amplifying the first current (I1); and/or
mirroring and amplifying the second current (I2); and/or
mirroring and amplifying the third current (I3); and/or
mirroring and amplifying the fourth current (I4).

* * * * *